United States Patent
Geyari et al.

(10) Patent No.: US 11,283,434 B2
(45) Date of Patent: Mar. 22, 2022

(54) GLITCH PROTECTION SYSTEM AND RESET SCHEME FOR SECURE MEMORY DEVICES

(71) Applicant: Infineon Technologies LLC, San Jose, CA (US)

(72) Inventors: Eran Geyari, Netanya (IL); Oren Shlomo, Haifa (IL); Yair Sofer, Tel Aviv (IL); Avri Harush, Herzeliya (IL)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 17/241,499

(22) Filed: Apr. 27, 2021

(65) Prior Publication Data

US 2022/0014181 A1 Jan. 13, 2022

Related U.S. Application Data

(60) Provisional application No. 63/048,975, filed on Jul. 7, 2020.

(51) Int. Cl.
| | |
|---|---|
| *H03K 5/125* | (2006.01) |
| *H03K 5/1252* | (2006.01) |
| *H03K 5/153* | (2006.01) |
| *H03K 5/19* | (2006.01) |
| *G11C 7/20* | (2006.01) |
| *H03K 17/24* | (2006.01) |
| *G11C 7/02* | (2006.01) |
| *H03K 17/22* | (2006.01) |

(52) U.S. Cl.
CPC ............ *H03K 5/1252* (2013.01); *G11C 7/02* (2013.01); *G11C 7/20* (2013.01); *H03K 5/153* (2013.01); *H03K 5/19* (2013.01); *H03K 17/223* (2013.01); *H03K 17/24* (2013.01)

(58) Field of Classification Search
CPC combination set(s) only.
See application file for complete search history.

(56) References Cited

U.S. PATENT DOCUMENTS

| | | |
|---|---|---|
| 2003/0014620 A1 | 1/2003 | Hanjani |
| 2012/0092046 A1 | 4/2012 | Li et al. |
| 2013/0207696 A1* | 8/2013 | Gonzalez ............ H03K 17/223 327/143 |
| 2015/0015283 A1 | 1/2015 | Park et al. |
| 2015/0236689 A1* | 8/2015 | Mandal .................... G06F 1/28 327/143 |

(Continued)

*Primary Examiner* — Long Nguyen

(57) ABSTRACT

A system and method for protecting against a voltage glitch are provided. Generally, the system includes a reset-detector coupled to a supply voltage (VCC) and to a power-on-reset (POR) block, and a glitch-detector coupled to VCC and the reset-detector. The reset-detector is operable to provide a signal to the POR block to generate a global-reset-signal when VCC decreases below a minimum and remains low for at least a first time. The glitch-detector is operable to provide a glitch-signal to the reset-detector to cause it to provide the signal to the POR block when VCC decreases below the minimum and remains low for at least a second time, where the second time is less than the first. The reset-detector can further include a retention-circuit operable to recall a glitch-signal was received and signal the POR block when VCC is restored. Other embodiments are also disclosed.

20 Claims, 7 Drawing Sheets

(56) References Cited

U.S. PATENT DOCUMENTS

2016/0012919 A1    1/2016   Bouzekri
2016/0105169 A1    4/2016   Lou
2016/0261264 A1    9/2016   Mai

* cited by examiner

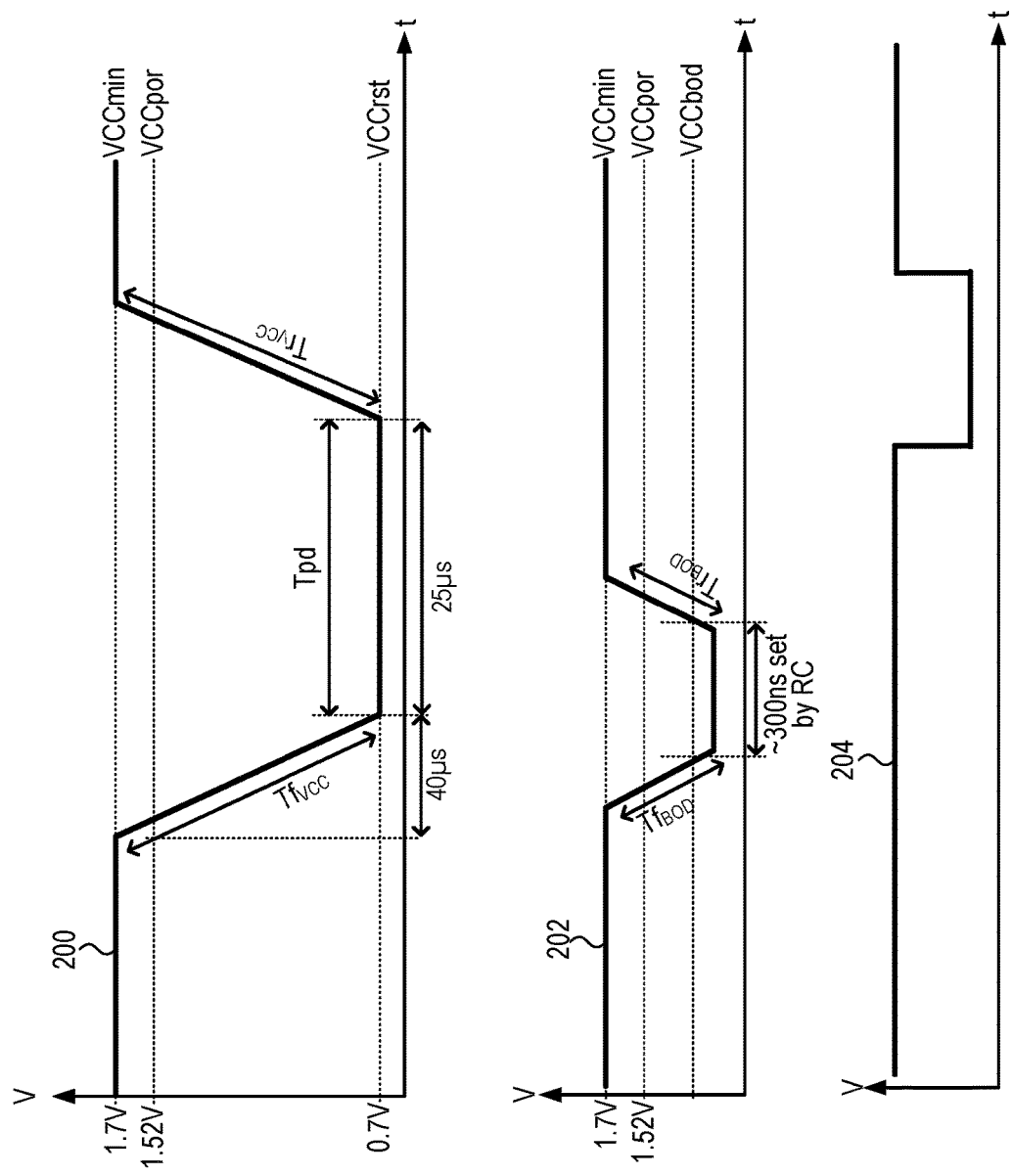
FIG. 2
(Conventional)

GLITCH PROTECTION SYSTEM AND RESET SCHEME FOR SECURE MEMORY DEVICES

CROSS-REFERENCE TO RELATED APPLICATIONS

This application is claims the benefit of priority under 35 U.S.C. 119(e) to U.S. Provisional Patent Application Ser. No. 63/048,975, filed Jul. 7, 2020, which is incorporated by reference herein in its entirety.

TECHNICAL FIELD

This disclosure relates generally to secure memory devices, and more particularly to systems and methods for detecting and protecting against a side channel voltage glitch attack in a secure memory device.

BACKGROUND

FIG. 1 is a schematic block diagram illustrating a side channel voltage glitch attack (SCA) on a secure chip 100. Referring to FIG. 1, in a SCA, hackers use external hardware 102 to cause a glitch 104 on the chip's main supply voltage (VCC 106) to cause the analog and/or digital circuits and elements chip to operate in unstable or under abnormal conditions, which can enable the attacker to access confidential data, such as encryption keys, etc. . . . , stored in a memory 108 of the secure chip. By glitch it is meant a very fast, very brief lowering of VCC from standard complementary-metal-oxide-silicon (CMOS) voltage levels to 0V or even negative voltage, followed by a similarly rapid rise back the supply again. As shown in FIG. 1 the glitch 104 can cause the output voltage from the VCC 106 to drop, for example, from a standard CMOS voltage to any level, even negative voltage, for a time period as brief as about 20 ns. SCA have become a severe issue for many secure systems, and in particular for secure non-volatile or flash memory systems.

Existing secure chips typically include one or more conventional power reset circuits, such as a CMOS voltage level reset-detector designed to detect larger decreases in VCC occurring at slow rate or slope, and a brown out-detector (BOD) designed to detect smaller drops in the VCC, occurring at rate which is limited by specifications. Both detectors generally use comparator level-sensors. Both types of-detector are time based, requiring a long power down time (tpD) at or below a trip point before initiating a reset, and thus have a very slow response, too long to detect a voltage glitch of an SCA as previously described. Additionally, both CMOS voltage level reset-detectors and BOD are integrally formed in the same circuit as the secure chip and experience the same drop in supply voltage or VCC. Because the-detectors cannot operate under the extreme voltage conditions which are forced during a glitch event, they may fail to detect such glitch attacks. This is especially problematic for detectors made using CMOS devices, which are unable to operate at sub-CMOS and/or negative voltages.

FIG. 2 shows timing diagrams of typical voltages and signals in a conventional power reset scheme using a CMOS voltage level reset-detector and BOD. In particular, line 200 in the top diagram represents a drop in VCC that would be detected by a conventional CMOS voltage level reset-detector, which would then trigger a RESET_PULSE 204 (shown in the lower diagram) resulting in a safe reset of all circuits and elements on the chip. Line 202 in the middle diagram represents a lesser drop in VCC that could be detected by a conventional brown-out-detector (BOD) (not shown), which would then trigger the RESET_PULSE 204.

Referring to FIG. 2 it is noted that the conventional CMOS voltage level reset-detector is capable of detecting a drop in VCC from a predefined minimum CMOS VCC ($VCC_{MIN}$) of about 1.7V to a reset VCC ($VCC_{rst}$) of about 0.7V at a fall slope magnitude ($Tf_{VCC}$) of about 40 µsec/1V, and will trigger the RESET_PULSE 204 after a relatively long tpD of at least about 25 µsec. It is further noted that the RESET_PULSE 204 is not be de-asserted until after a further time required for the VCC to recover to a power-on-reset voltage (VCCpor) of about 1.52V.

Similarly, as shown in the middle diagram of FIG. 2 a conventional BOD is capable of detecting a smaller drop in VCC from a $VCC_{MIN}$ of about 1.7 V to a brown out VCC trip level ($VCC_{bod}$) of about 1.45V at a gentler or lower falling slope magnitude ($Tf_{BOD}$). The power down time (tpD) required for the BOD is generally set by a resistor-capacitor (RC) filter circuit in the BOD and is, for example, typically on the order of about 300 ns.

Accordingly, there is a need for a system and method or scheme for detecting and protecting against a side channel voltage glitch attack in a secure memory device. It is further desirable that the glitch detection and protection system and method not interfere with existing CMOS voltage level reset-detectors or brown-out-detectors, otherwise adversely impact operation of the secure chip or memory device in which it is included or used.

SUMMARY

A glitch protection system and method are provided for detecting and protecting against a side channel voltage glitch attack. Generally, the system includes at least a first reset-detector coupled to a supply voltage (VCC) and to a power-on-reset (POR) block, and a glitch-detector coupled to the supply voltage and the reset-detector. The reset-detector is configured or operable to detect a drop in VCC and to provide a reset-detect (RES_DET) signal to cause the POR block to generate a global-reset-signal when the supply voltage decreases below a minimum supply voltage ($VCC_{MIN}$) with at least a first slope magnitude ($1^{st}$ $T_f$) and remains low for at least a first time ($1^{st}$ tpD). The glitch-detector is configured or operable to detect a glitch, a very fast and brief drop in VCC to 0V or even negative voltages, and to provide a glitch-detect (GLTH_DET) signal to the reset-detector to cause the POR block to generate the global-reset-signal when the supply voltage decreases below the $VCC_{MIN}$ with at least a second slope magnitude ($2^{nd}$ $T_f$) and remains low for at least a second time ($2^{nd}$ tpD), where the second time is less than the first time. The system can further include a retention-circuit in the reset-detector configured or operable to recall a glitch was detected and send the RES_DET signal to the POR block when the VCC is restored to the reset-detector. In this way upon glitch detection the glitch protection system will perform a safe reset under all conditions of supply ramps and levels, defending a chip in which it is used against any and all side channel voltage glitch attacks without impacting chip performance.

In another aspect a method for protecting against a side channel voltage glitch attack (SCA) in a secure memory system is provided. Generally, the method includes monitoring a supply voltage (VCC) using a reset-detector coupled to the supply voltage and to a power-on-reset (POR) block, and when the supply voltage decreases below a minimum supply voltage ($VCC_{MIN}$) and remains low for at least a first time providing a reset detect (RST_DET) signal from the reset-detector to the POR block to generate a global-reset-signal. Simultaneously, or concurrently the supply voltage is monitored using a glitch-detector coupled to the supply voltage and the reset-detector, and when the supply voltage decreases below $VCC_{MIN}$ and remains low for at least a second time providing a glitch-detect (GLTH_DET) signal to the reset-detector to cause the POR block to generate the global-reset-signal, where the second time is less than the first time. Finally, circuits in the secure memory system are reset in response to the global-reset-signal from the POR block, thereby protecting against a side channel voltage glitch attack (SCA) in the secure memory system.

In some embodiments, providing the GLTH_DET signal to the reset-detector includes retaining a 'memory' that the GLTH_DET signal was received in the reset-detector, and, when the supply voltage is restored to the reset-detector, recalling that the GLTH_DET signal was received causing the reset-detector to provide the RST_DET signal to the POR block to perform a safe POR. Retaining and recalling the GLTH_DET signal was received can include discharging an internal trip point node in the reset-detector prior to losing the supply voltage to the reset-detector.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 2 are timing diagrams showing typical voltages and signals in a conventional power reset scheme;

DETAILED DESCRIPTION

A glitch protection system and method for detecting and protecting against a side channel voltage glitch attack or side channel attack (SCA) are disclosed.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 1:
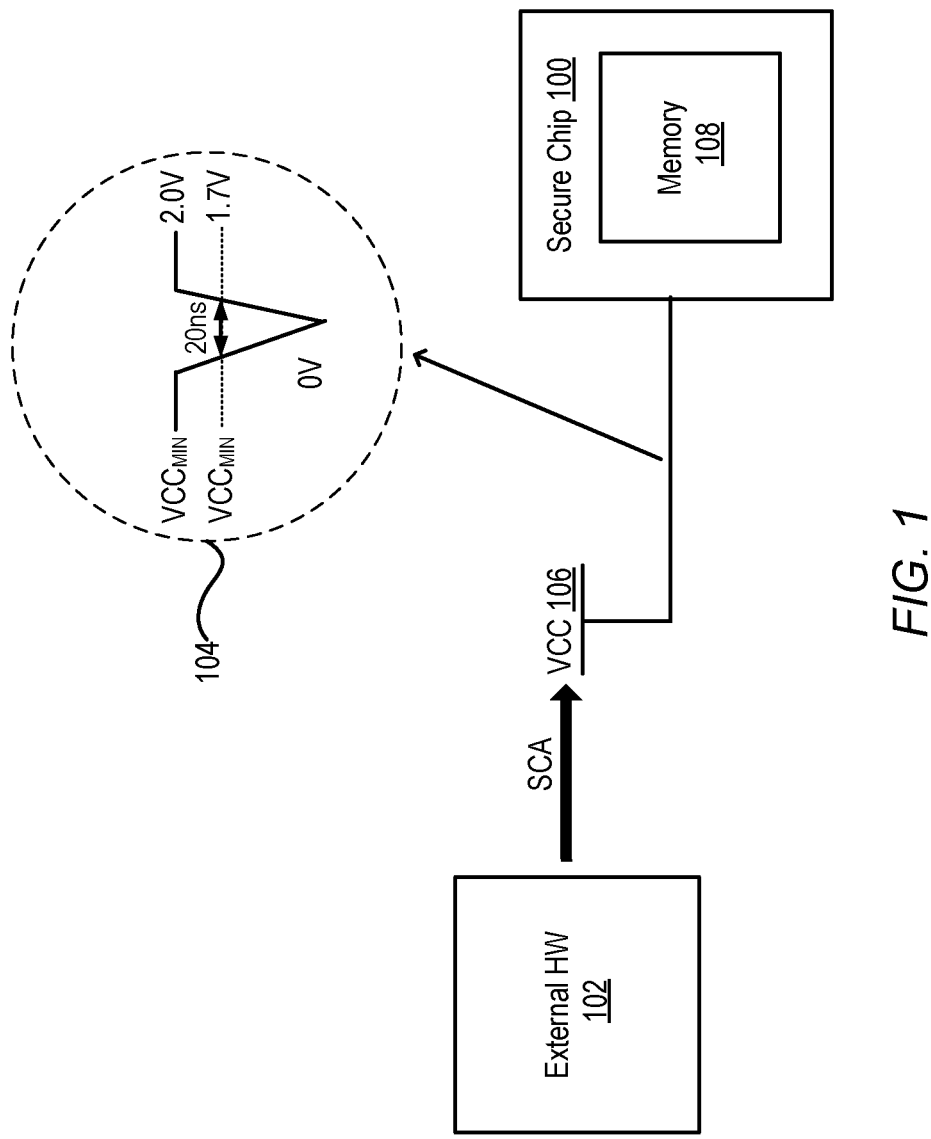
FIG. 1 is a schematic block diagram illustrating a side channel voltage glitch attack (SCA) on a secure chip.
Figure 3:
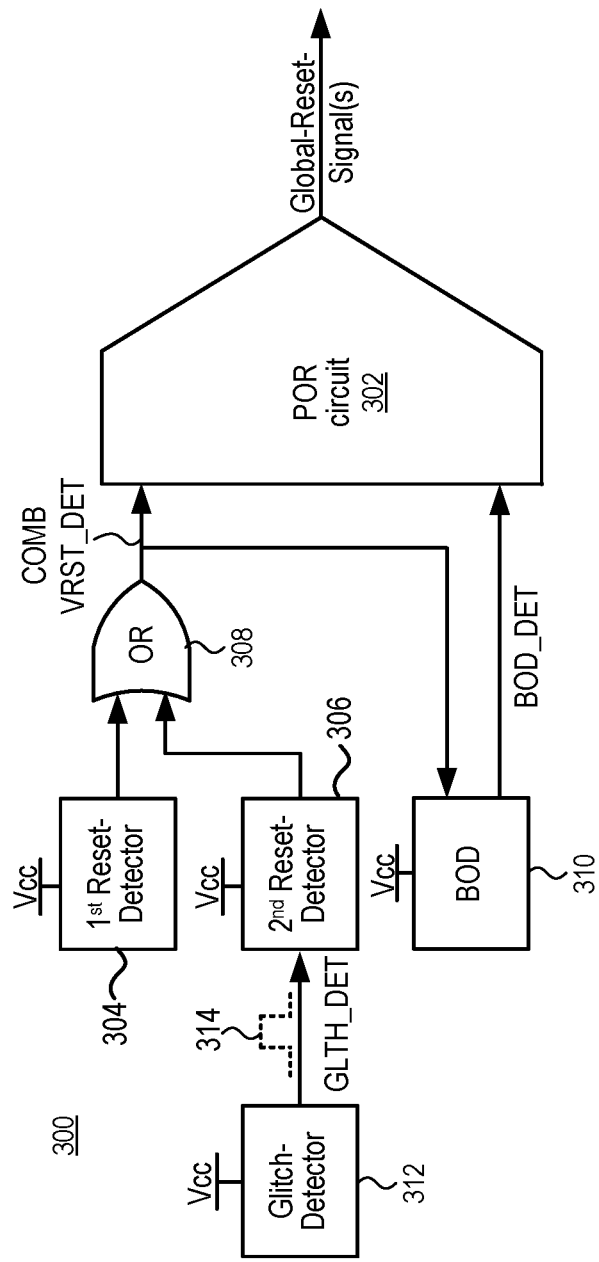
FIG. 3 is a schematic block diagram illustrating another embodiment of a glitch protection system including first and second reset-detectors, an OR gate, a brown-out-detector and a glitch-detector.

Embodiments of a power-reset circuit or glitch protection system including a glitch-detector will now be described with reference to FIG. 3. Referring to FIG. 3, in one embodiment the glitch protection system 300 includes a safe reset and power-on-reset (POR) block 302 or circuit, a first reset-detector 304, such as a complementary-metal-oxide-silicon (CMOS) voltage level (VCS) reset-detector, a second reset-detector 306 and an OR gate 308, through which a first and second reset-detectors 304, 306, are coupled to the POR block 302, a brown-out-detector (BOD 310) and a glitch-detector 312.

The safe reset and POR block 302 receives a system reset signal from either one of the reset-detectors 304, 306, through the OR gate 308 or from the BOD 310, and generates one or more global-reset-signals to analog and digital or logical devices and circuits on the secure chip (not shown in this figure) to power up the devices and circuits in a predefined POR sequence. An important advantage of the glitch protection system 300 is that the POR sequence is the same regardless of the event which causes the reset, whether the reset signal originates from the glitch-detector 312 through the second reset-detector 306, from the first reset-detector 304 and through the OR gate 308, or from the BOD 310. Using the same reset POR sequence is desirable to ensure the device or secure chip in which the glitch protection system 300 is embodied or included will power up in substantially the same manner for any reset event, including a glitch event, for which a trip set-point has been exceeded. Generally, the POR sequence includes an analog portion or sequence, which involves ramping power supplies to analog circuits and elements in a pre-defined order, and a digital portion, which consists of downloading data from a memory, such as a flash array in the device, during the secure power up sequence.

The first reset-detector 304 is coupled to a main voltage supply (VCC) and through the OR gate 308 to the POR block 302. The first reset-detector 304 is configured or operable to detect a relatively slow drop in VCC with at least a first slope magnitude ($1^{st} T_f$) to a level below a predefined minimum VCC trip set-point ($VCC_{MIN}$) for at least a predefined first power down time (1$^{st}$ tpD), and to provide a first reset signal (VRST_DET) to the OR gate 308 which then provides a combined VRST_DET (COMB VRST_DET) to the POR block 302 to trigger the POR sequence. By a slow drop in VCC it is meant a drop in VCC in which the first slope magnitude (1$^{st}$ T$_f$) is less than a slope expected to be encountered due to a glitch event, where VCC$_{MIN}$ is much greater than a predefined glitch voltage (VCC$_{GLITCH}$) or trip set-point, and where the first power down time (1$^{st}$ tpD) is much longer than a minimum expected duration of the glitch voltage or about greater than about 20 ns. The OR gate 308 is configured or operable to provide a HIGH output (1) if one or both of the inputs to the gate are HIGH. The use of the OR gate 308 is advantageous in that enables the glitch protection system 300 to be implemented through the addition of the second reset-detector 306, glitch-detector 312 and OR gate 308 to existing blocks or elements of a traditional reset circuit (not shown).

As shown in FIG. 3, the glitch-detector 312 is also coupled to the main voltage supply (VCC), to the second reset-detector 306, and, through the second reset-detector, to the POR block 302. The glitch-detector 312 is configured or operable to detect a glitch in VCC with at least a second slope magnitude (2$^{nd}$ T$_f$) dropping to a level at or below VCC$_{GLITCH}$ for at least a predefined second power down time (2$^{nd}$ tpD), and to provide a glitch-detect signal (GLTH_DET), such as pulse 314, to the second reset-detector 306 to cause the second reset-detector to provide a second VRST_DET signal to the OR gate 308, which then provides the COMB VRST_DET signal to the POR block 302 to trigger the POR sequence. As noted above, VCC$_{GLITCH}$ is much less than VCC$_{MIN}$, the second power down time (2$^{nd}$ tpD) is less than the first power down time (1$^{st}$ tpD), and the second slope magnitude (2$^{nd}$ T$_f$) is greater than the first slope magnitude (1$^{st}$ T$_f$). It is further noted that because a minimum glitch voltage (VCC$_{GLITCH-MIN}$) encountered during a glitch event can be less than 0V, VCC$_{GLITCH-MIN}$ can be predefined to be any voltage below VCC$_{MIN}$, including 0V or a negative voltage.

The glitch-detector 312 can include any number of transistors, switching-elements, amplifiers and/or comparators configured or operable to detect rapid drops, in the main supply voltage (VCC) to a level at or below the glitch voltage (VCC$_{GLITCH}$) for at least the second power down time (2$^{nd}$ tpD), and to provide the glitch-detect signal (GLTH_DET), such as pulse 314, to the second reset-detector 306. Generally, the glitch-detector 312 is capable of detecting drops in VCC occurring at a rate of 1V/μs or greater and having a power down time (2$^{nd}$ tpD) of from 25 μs to less than about 20 ns. Additionally, the glitch-detector 312 should be capable of detecting drops in VCC from a maximum CMOS voltage (VCC$_{MAX}$) down to a minimum glitch voltage (VCC$_{GLITCH-MIN}$), where the minimum glitch voltage can include both 0V and negative supply voltages below 0V.

Additionally, because the detectors and blocks of the glitch protection system 300 are generally powered by the main voltage supply and are likewise subject to glitches and drops in VCC, the second reset-detector 306 further includes a retention-circuit (shown and described in further detail below) through which the glitch-detector 312 is coupled to the second reset-detector that is configured or operable to recall the glitch-detect signal was received and to cause the second reset-detector to provide the reset signal (VRST_DET) to the POR block 302 when the supply voltage is restored to a level above a power-on-reset voltage (VCCpor).

Finally, it is desirable that the glitch-detector 312 is capable of providing a glitch-detect signal (GLTH_DET) or pulse 314 having a sufficient duration or pulse width of from just a few nanoseconds (ns) to greater than about 10 ns, which will ensure the signal is received and retained in the second reset-detector 306, and which will further ensure that in the event of power loss to the glitch-detector 312, the second reset-detector 306 or the POR block 302 the COMB VRST_DET signal is sent to the POR block when the supply voltage is restored to a level above a power-on-reset voltage (VCCpor), and a safe, full reset of the secure chip is executed.

Suitable glitch-detectors can include, for example, those described in commonly assigned co-pending U.S. patent application Ser. No. 17/241,447, filed Apr. 27, 2021, which is incorporated by reference herein in its entirety.

The BOD 310 is coupled to the main voltage supply (VCC), an output of the OR gate 308, and to the POR block 302. The BOD 310 includes voltage level comparator sensors and is configured or operable to detect smaller drops in VCC occurring over a predefined time or a drop in VCC relative to a reference voltage. Generally, the BOD 310 detects drops in VCC occurring at rate or slope lower than those detected by the first reset-detector 304 or the glitch-detector 312, and to a predefined minimum brown out detector (BOD) voltage (VCC$_{BOD}$) higher than VCC$_{MIN}$ and VCC$_{GLITCH}$. The BOD 310 is configured or operable to provide a BOD reset signal (BOD_DET) to the POR block 302 when a brown out event, i.e., a drop in VCC to a level below VCC$_{BOD}$, occurs and continues for a predefined time (brown out tpD) to trigger the POR. The COMB VRST_DET signal from the output of the OR gate 308 as the COMB VRST_DET is an always on or a logic high signal, while the BOD is off during standby, i.e., when a brown out is not detected, and thus the output of the BOD 310 is normally latched. In case of power down while the BOD 310 is in standby mode, the COMB VRST_DET will reset the output the latch in the BOD detector.

Figure 4:
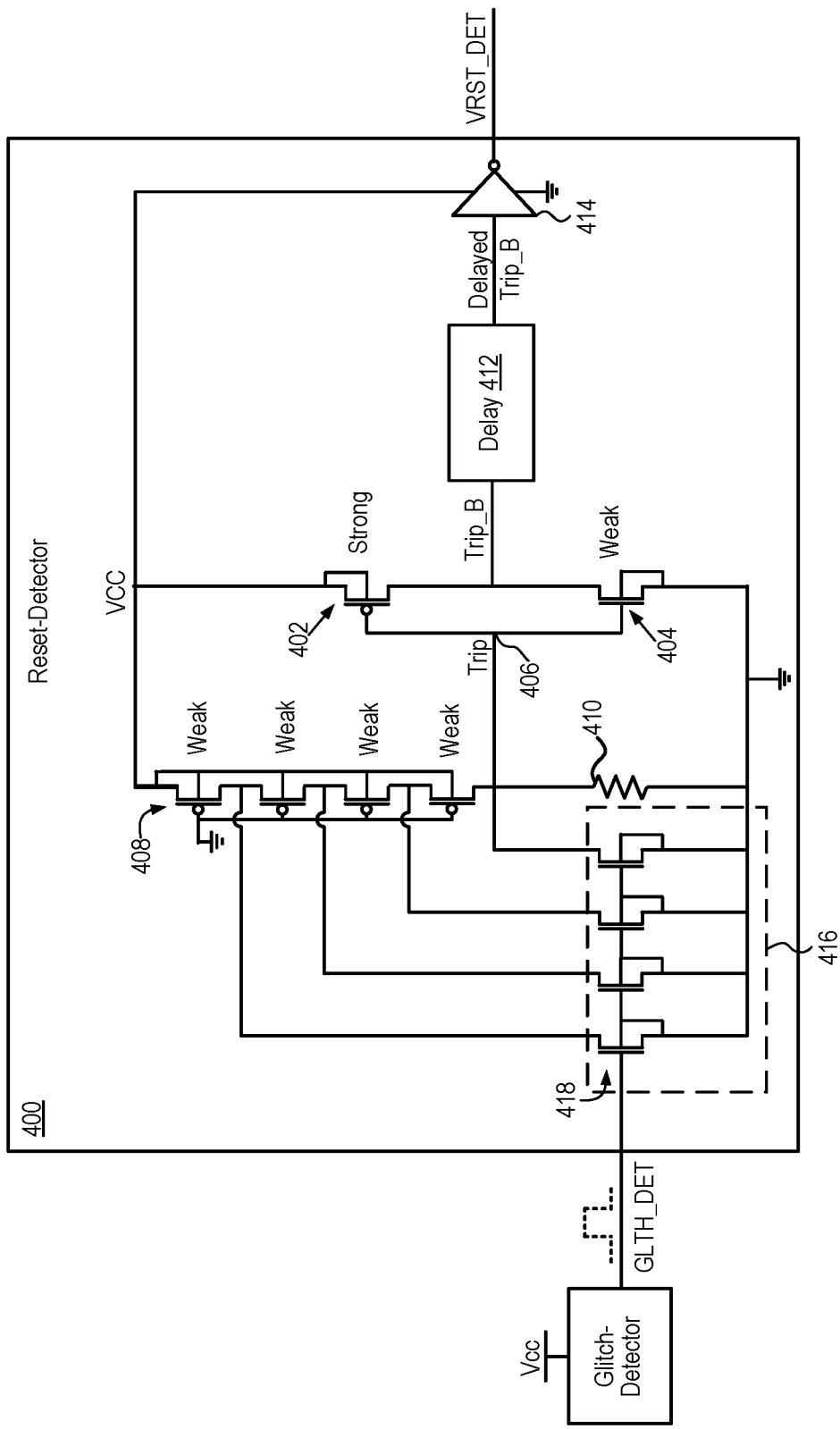
FIG. 4 is a schematic diagram illustrating an embodiment of a reset-detector including a retention-circuit to recall a glitch was detected when power is restored to the reset-detector.

FIG. 4 is a schematic diagram illustrating an embodiment of a reset-detector 400 having an input to receive the glitch-detect signal (GLTH_DET). Referring to FIG. 4 the reset-detector 400 includes an inverter is constructed from a strong p-type Metal-Oxide-Silicon (pMOS) transistor 402 and a weak n-type Metal-Oxide-Silicon (nMOS) transistor 404 connected in series between the main voltage supply (VCC and ground, and a trip-node 406 formed between gates of the pMOS and nMOS transistors. In normal operation, that is operation with a steady main voltage supply above VCC$_{MIN}$, the trip-node 406 is biased by a resistor-capacitor (RC) divider formed by a number of weak pMOS transistors (collectively 408) and a resistor 410 connected in series between VCC and ground. The resistance of the resistor 410 is selected to be relatively large, on the order of about 5 mega-ohm, to avoid excessive current flow and power consumption by the reset-detector 400 during normal operation, i.e., prior to a reset event, either a glitch or a slow drop in VCC.

During normal operation, the trip-node 406 is at a high voltage or logic 1 and a logic complement (Trip_B) is coupled through a delay circuit 412 and an inverter 414 to provide logic high or 1 to a VRST_DET output of the reset-detector 400. During a low level reset event, that is reset caused by a slow, relatively long drop in the main supply voltage, the trip-node 406 is slowly discharged towards ground (a logic 0) through the resistor 410. When the trip-node 406 is sufficiently discharged the strong pMOS transistor 402 is turned off and the weak nMOS transistor 404 turned on, flipping the logic complement (Trip_B) to a logic 1 and, after a delay by the delay circuit 412 the reset-detector 400 outputs a VRST_DET signal (logic 0) which causes the POR block (not shown in this figure) to initiate a POR sequence when the supply voltage is restored to a level above a power-on-reset voltage (VCCpor).

During a glitch event a glitch detection (GLTH_DET) signal is received in the reset-detector 400 that causes trip-node 406 to be quickly discharged to the trip set point (logic 0), flipping the logic complement (Trip_B) to a logic 1 and, after a delay by the delay circuit 412 the reset-detector 400 outputs a logic 0 VRST_DET signal causing the POR block to initiate the POR sequence.

In some embodiments, the reset-detector 400 further includes a retention-circuit 416 to enable the storing and recall of a glitch event following loss of power to the reset-detector 400 upon restoration of power to the reset-detector 400. In the embodiment shown in FIG. 4 the retention-circuit 416 is a pull-down circuit, including a number of nMOS transistors (collectively 418) coupled in parallel between source/drain (S/D) junctions of the weak pMOS transistors (collectively 408) and ground so that a glitch detection (GLTH_DET) signal coupled to the gates of the nMOS transistors 418 will cause the transistors to turn on, quickly discharging the trip-node 406 and causing the reset-detector 400 to outputs a VRST_DET signal resulting in the POR block initiating the POR sequence. It is noted that transistors of the pull-down circuit are nMOS, once turned on by the glitch detection (GLTH_DET) signal, the number of nMOS transistors 418 will remain on causing the trip-node 406 to be discharged when power is restored to the reset-detector 400, thereby remembering or recalling that a glitch event has been detected, and signaling the POR block to perform the full POR sequence ensuring a secure chip or device is protected from a side channel voltage glitch attack or side channel attack (SCA). Upon return of VCC a safe reset pulse can be applied to the glitch detector input of the reset-detector 400 to restore the reset-detector to a previous, nominal set-point at the trip-node 406.

Figure 5:
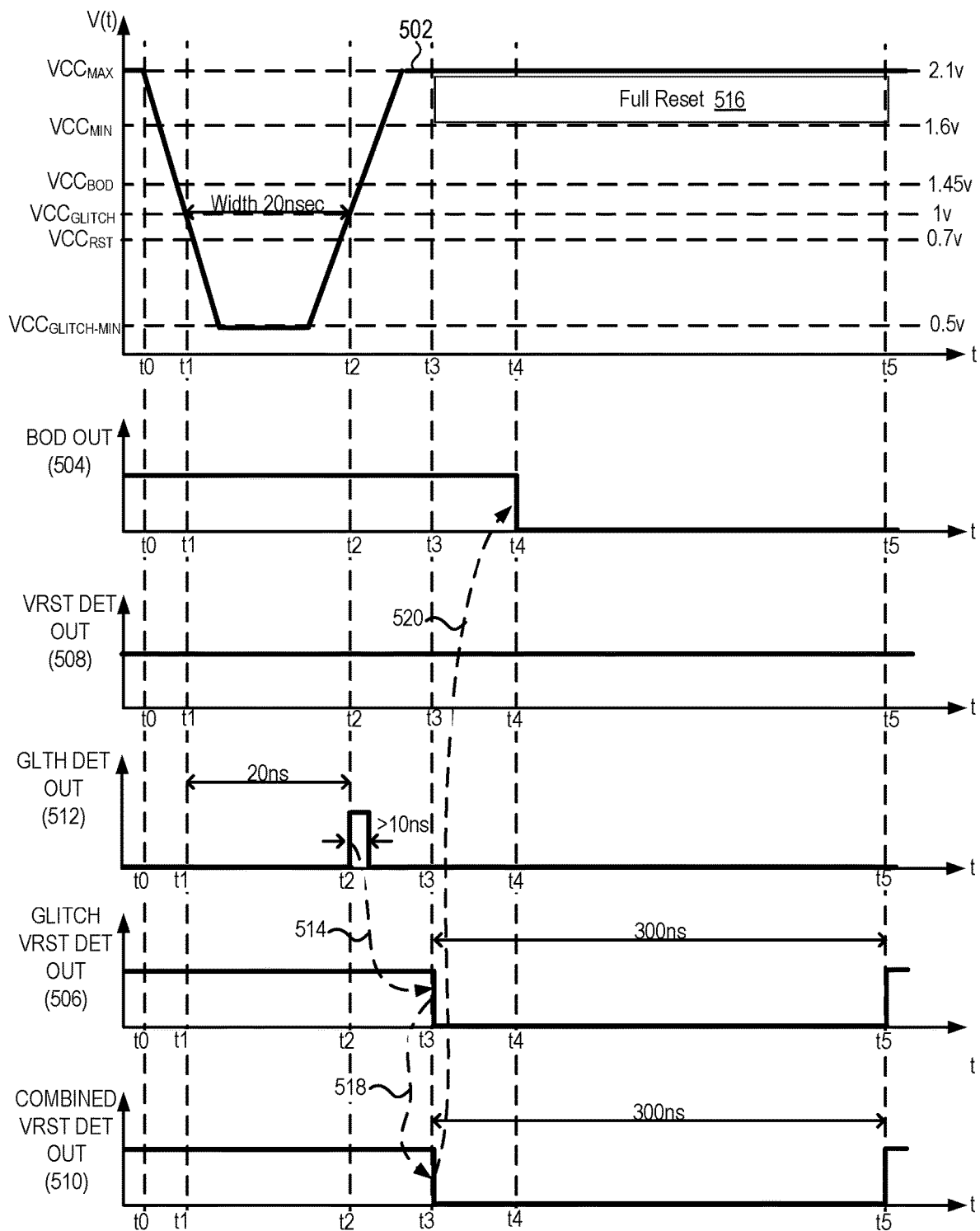
FIG. 5 are timing diagrams showing signals in an embodiment of a glitch detection and protection power reset scheme.
Figure 6:
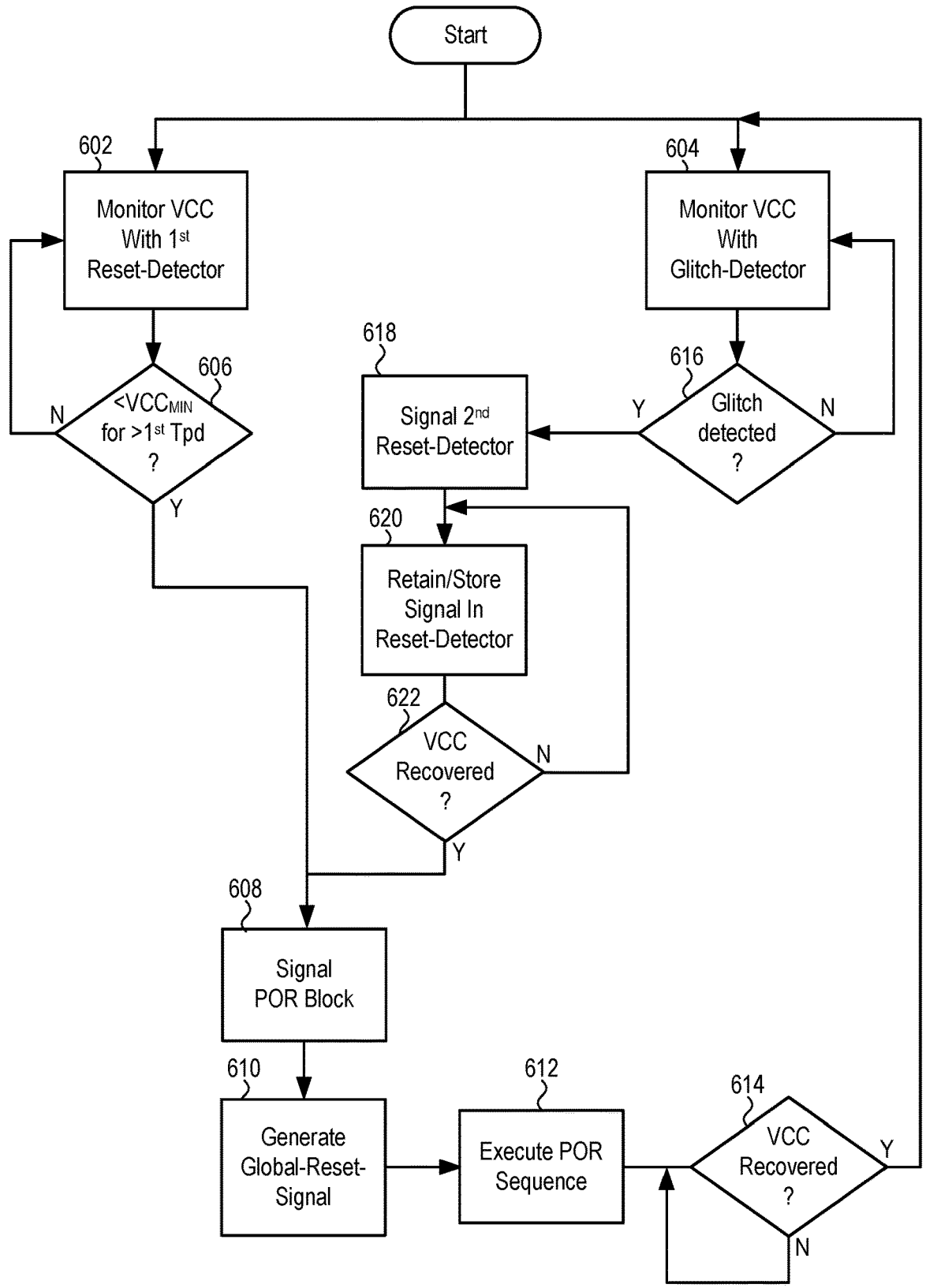
FIG. 6 is a flowchart illustrating a method of operating a system including glitch protection system with a glitch-detector to detect and protect against a side channel voltage glitch attack (SCA)

FIG. 5 are timing diagrams showing signals in a glitch protection system resulting from detection of a glitch event will now be described with reference to FIGS. 5 and 6. In particular, FIG. 5 illustrates signals resulting from detection of a 20 ns glitch event.

Referring to FIG. 5 at an initial time (t0) VCC, shown by line 502 in the top diagram, begins dropping rapidly from an initial voltage level (VCCMAX), past a minimum VCC level for CMOS (VCCMIN) to pass a glitch voltage ($VCC_{GLITCH}$) at a first time (t1), the beginning of the power down time of the glitch event. At this time, and until the predetermined second power down time ($2^{nd}$ tpD) or width of the glitch event has elapsed, the output of a BOD (BOD OUT 504), the output of a first reset-detector coupled to a glitch-detector (GLTH VRST DET OUT 506), and the outputs of a second reset-detector not coupled to a glitch-detector (VRST DET OUT 508) and the output of an OR gate coupled to the first and second reset-detector (COMBINED VRST DET OUT 510) all remain unchanged in a normal, i.e., no event detected state. The output of the glitch-detector (GLTH DET OUT 512) also remains low, at logic 0.

At a second time (t2) corresponding to the predetermined second power down time ($2^{nd}$ tpD) and the width of the glitch-event, shown here as equal to about 20 ns, the glitch-detector outputs a high or logic 1 glitch-detection signal (GLTH DET OUT 512) to the second reset-detector coupled to the glitch-detector, as represented by dashed arrow 514. Generally, as in the embodiment shown the glitch-detection signal is a pulse having a pulse width of from just a few nanoseconds (ns) to greater than about 10 ns. The glitch-detection signal causes the output the second reset-detector (GLTH VRST DET OUT 506) to go low at a third time (t3), signaling a POR block to initiate or perform a full POR reset sequence 516. At substantially the same time the GLTH VRST DET OUT 506 is coupled to an OR gate, as represented by dashed arrow 518, which causes the COMBINED VRST DET OUT 510 of the OR gate to go low. The COMBINED VRST DET OUT 510 is coupled to a BOD, as represented by dashed arrow 520, and a shortly thereafter at time (t4) the output of the BOD (BOD OUT 504) also goes low. Finally, after a predetermined delay from the GLTH VRST DET OUT 506 and the COMBINED VRST DET OUT 510 going low at time (t3), shown here as about 300 ns, at a fifth time (t5) the POR reset sequence 516 is completed and the GLTH VRST DET OUT 506 and the COMBINED VRST DET OUT 510 return to a high value. Upon restoration of the GLTH VRST DET OUT 506 and the COMBINED VRST DET OUT 510 to a high level, and where VCC is back to high level for long enough above the BOD trip-point, the BOD output will return to a normal output.

It is noted that throughout times t0 to time t5 the output of the second reset-detector not coupled to a glitch-detector (VRST DET OUT 508) remain at a high level, because the second reset-detector not receive the glitch detected signal (GLTH DET OUT 512), and a slow, long drop in VCC has not been detected.

It is further noted that VCC (line 502) begins returning to normal levels, that is greater than $VCC_{MIN}$, before time (t2) after having reached a low level of VCC GLITCH MIN, and has returned to $VCC_{GLITCH}$ level at time (t2) and is above $VCC_{MIN}$ before the POR reset sequence 516 is initiated by the GLTH VRST DET OUT 506 and the COMBINED VRST DET OUT 510. Thus, because of the short width or duration of the glitch event, neither the glitch-detector, BOD, reset-detector(s) the POR block or other circuits on the secure chip will have completely powered down, but a full POR reset sequence 516 is initiated nevertheless, thereby protecting the secure chip against the side channel voltage glitch attack (SCA).

A method of operating a system including glitch protection system with a glitch-detector to detect and protect against a side channel voltage glitch attack (SCA) in a secure system will now described with reference to the flowchart FIG. 6. Referring to FIG. 6, the method begins with monitoring a supply voltage (VCC) with a first reset-detector coupled to the supply voltage and to a power-on-reset (POR) block (step 602). Substantially simultaneously or concurrently the supply voltage is monitored using a glitch-detector coupled to VCC and to the first reset-detector (step 604). Next, it is determined the supply voltage VCC is below a predefined minimum supply voltage ($VCC_{MIN}$) and remains low for at least a first time ($1^{st}$ tpD) (step 606). If VCC is below $VCC_{MIN}$ for a time≥to the $1^{st}$ tpD a first reset detected signal (RST_DET) is provided to a POR block (step 608), and generate global-reset-signal(s) using the POR block (step 610) and execute a POR reset scheme (step 612). Once VCC is recovered and remains high after returning for a predefined period of time enough, the reset pulse is terminated, and the process of monitoring VCC with the first reset-detector and with the glitch-detector is continued (step 614).

If a glitch is detected (step 616) while concurrently monitoring VCC using the first glitch-detector (step 602) a glitch detected signal is generated and provided to a glitch detected input of the second reset-detector (step 618), otherwise monitoring VCC using the glitch-detector is continued (step 604). As described above, the glitch is detected when the supply voltage VCC decreases below $VCC_{GLITCH}$ and remains low for at least a second time ($2^{nd}$ tpD), where the second time is less than the first time ($1^{st}$ tpD), and is generally between 25 μs to less than about 20 ns. Additionally, a rate or slope at which VCC drops during a glitch event is generally much greater than the rate or slope at which VCC drops for a low CMOS level event detected by the first reset detector in steps 602 and 606. Optionally or preferably, the second reset detector includes a retention circuit, such as described in FIG. 4, and the glitch detected signal is retained or stored in the second reset-detector (step 620). As described above, the glitch detected signal can be retained or stored in the second reset-detector by using number of shunt nMOS transistors 418 in the retention-circuit 416 to pull or discharge the trip-node 406 to GND. When VCC is restored (step 622), the second reset-detector senses that an internal trip point, such as trip-node 406 in FIG. 4, is grounded and generates a second RST_DET signal which is then provided to the POR block (step 608), the global-reset-signal(s) generated using the POR block (step 610) and a POR reset scheme executed (step 612). Once VCC is recovered and remains high after returning for a predefined period of time enough, the reset pulse is terminated, and the process of monitoring VCC with the first reset-detector and with the glitch-detector is continued (step 614).

Next, it is determined whether VCC has recovered above a (step 618), and if VCC has recovered a reset signal is generated and coupled to the first reset-detector to reset the retention circuit (step 620), and the process is continued to monitor VCC with the first reset-detector (step 602) and with the glitch-detector (step 604).

Figure 7:
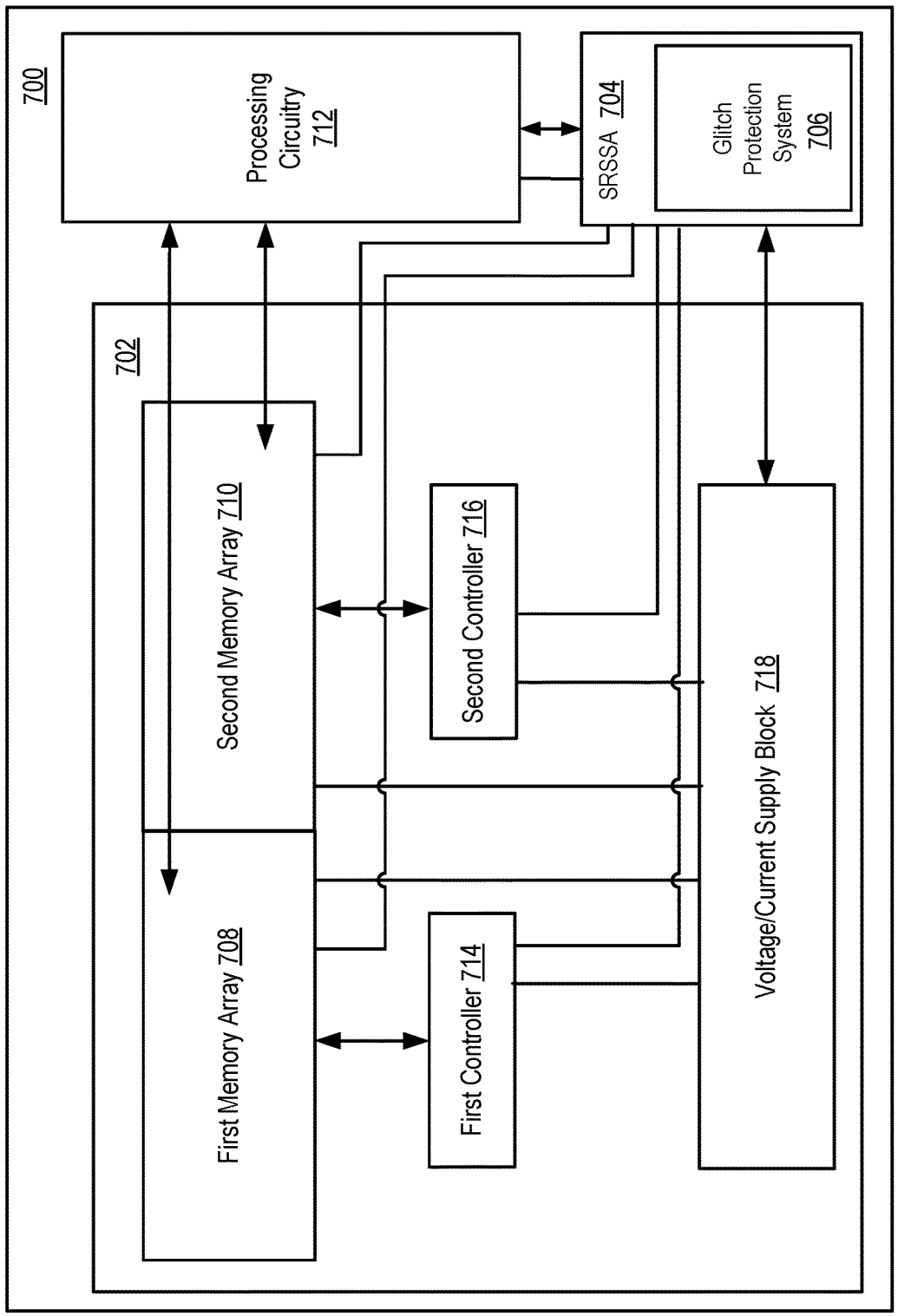
FIG. 7 is a block diagram of an embedded non-volatile memory (eNVM) system including a System Reset Sub System Analog (SRSSA) block with a glitch protection system including a glitch-detector to protect against a SCA.

FIG. 7 is a block diagram of a secure system or secure chip 700 including an embedded memory 702, such as a non-volatile memory (eNVM) or flash memory, and a System Reset Sub System Analog (SRSSA) block 704 including a glitch protection system 706 for protection against side channel voltage glitch attacks (SCAs). Referring to FIG. 7 the memory 702 includes a number of memory arrays, such as a first memory array 708 and a second memory array 710, each including an array of non-volatile memory cells, and each controlled by processing circuitry 712 integrally formed on the secure chip 700. Generally, the memory 702 further includes first and second controllers 714, 716, which are each configured or operable to provide support for read operations as well as program and erase operations for the first and second memory arrays 708, 710, respectively, and a voltage/current supply block 718. The voltage/current supply block 718 is a multi-purpose mixed-signal block configured or operable to provide memory 702 with a range of voltages, currents, and digital signals/indicators that are utilized for the different modes of operation listed above.

The SRSSA block 704 includes an embodiment of the glitch protection system 706, such as one of those described above, and is coupled to the processing circuitry 712 and to each block or circuit of the memory 702 and configured or operable to provide global-reset-signals to each block or circuit to execute a POR reset scheme that is substantially the same regardless of the event causing reset. The glitch protection system 706 ensures a safe reset will under all conditions of supply ramps and levels, defending the secure chip 700 against any and all side channel voltage glitch attacks without impacting performance of the secure chip or the memory 702.

It will further be appreciated that components of SRSSA block 704, including the glitch protection system 706, may be implemented on a same secure chip 700 with the memory 702 and processing circuitry 712, or on a separate chip coupled to the secure chip and configured or operable to monitor the main voltage supply (VCC) to the memory and processing circuitry, and configured or operable to provide global-reset-signals thereto.

Thus, a glitch protection system capable of detecting and protecting against rapid and short duration side channel voltage glitch attacks on a main supply voltage (VCC) down to 0V or negative voltages, and lasting from 25 μs to less than about 20 ns, and methods for operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A glitch protection system comprising:
a first reset-detector coupled to a supply voltage (VCC) and to a power-on-reset (POR) block, the first reset-detector operable to provide a reset (VRST_DET) signal to the POR block to generate a global-reset-signal when the supply voltage decreases below a minimum supply voltage ($VCC_{MIN}$) with at least a first slope magnitude ($1^{st}$ $T_f$) and remains low for at least a first time ($1^{st}$ tpD);
a glitch-detector coupled to the supply voltage and the first reset-detector, the glitch-detector operable to provide a glitch-detect (GLTH_DET) signal to the first reset-detector to cause the first reset-detector to provide the VRST_DET signal to the POR block when the supply voltage decreases below a glitch voltage ($VCC_{GLITCH}$) with at least a second slope magnitude ($2^{nd}$ $T_f$) and remains low for at least a second time ($2^{nd}$ tpD); and wherein the second time is less than the first time, $VCC_{GLITCH}$ is less than $VCC_{MIN}$ for at least the second time ($2^{nd}$ tpD).

2. The glitch protection system of claim 1 wherein the first reset-detector comprises a retention-circuit through which the glitch-detector is coupled to the first reset-detector, the retention-circuit operable to recall the GLTH_DET signal was received and to cause the first reset-detector to provide the VRST_DET signal to the POR block when the supply voltage is restored to the first reset-detector.

3. The glitch protection system of claim 2 wherein the retention-circuit comprises a number of NMOS transistors having gates coupled to the glitch-detector and connected in parallel to discharge an internal trip point node in the first reset-detector when the GLTH_DET signal is received.

4. The glitch protection system of claim 3 wherein GLTH_DET signal comprises a pulse having a pulse width of sufficient duration to discharge the internal trip point node to 0V.

5. The glitch protection system of claim 1 wherein the second slope magnitude ($2^{nd}$ $T_f$) is greater than the first slope magnitude ($1^{st}$ $T_f$).

6. The glitch protection system of claim 1 wherein the second time ($2^{nd}$ tpD) is at least 20 ns.

7. The glitch protection system of claim 1 further comprising a brown-out-detector (BOD) coupled to the supply voltage and to the POR block, the BOD operable to signal the POR block to generate the global-reset-signal when the supply voltage decreases below $VCC_{MIN}$ with a third slope magnitude ($3^{rd}$ $T_f$) and remains at or below a BOD voltage ($VCC_{BOD}$) for at least a third time ($3^{rd}$ tpD), wherein the third slope magnitude is less than the first slope magnitude, and $VCC_{BOD}$ is greater than $VCC_{GLITCH}$.

8. The glitch protection system of claim 1 further comprising a second reset-detector coupled to the supply voltage, wherein the first and the second reset-detector are coupled to the POR block through an OR gate, and are operable so that the VRST_DET signal from either the first reset-detector or the second reset-detector will cause the POR block to generate the global-reset-signal.

9. The glitch protection system of claim 1 wherein the glitch-detector is operable to provide the GLTH_DET signal for any supply voltage below the $VCC_{GLITCH}$, including negative supply voltages below 0V.

10. A system comprising:
a memory; and
a glitch protection system comprising:
a reset-detector coupled to a supply voltage (VCC) and to a power-on-reset (POR) block, the reset-detector operable to provide a reset detect (RST_DET) signal to the POR block to generate a global-reset-signal to the memory when the supply voltage decreases below a minimum supply voltage ($VCC_{MIN}$) with at least a first slope and remains low for at least a first time; and
a glitch-detector coupled to the supply voltage and the reset-detector, the glitch-detector operable to provide a glitch-detect (GLTH_DET) signal to the reset-detector to cause the reset-detector to provide the RST_DET signal to the POR block when the supply voltage decreases below the $VCC_{MIN}$ with at least a second slope and remains low for at least a second time, wherein the second time is less than the first time.

11. The system of claim 10 wherein the reset-detector comprises a retention-circuit through which the glitch-detector is coupled to the reset-detector, the retention-circuit operable to recall the GLTH_DET signal was received and to cause the reset-detector to provide the RST_DET signal to the POR block when the supply voltage is restored to the reset-detector.

12. The system of claim 11 wherein the retention-circuit comprises a number of NMOS transistors having gates coupled to the glitch-detector and connected in parallel to discharge an internal trip point node in the reset-detector when the GLTH_DET signal is received.

13. The system of claim 12 wherein GLTH_DET signal comprises a pulse having a pulse width of sufficient duration to discharge the internal trip point node to 0V.

14. The system of claim 10 wherein the glitch protection system further comprises a brown-out-detector (BOD) coupled to the supply voltage and to the POR block, the BOD operable to signal the POR block to generate the global-reset-signal when the supply voltage decreases below $VCC_{MIN}$ with a third slope and remains at or below a BOD voltage ($VCC_{BOD}$) for at least a third time, wherein the third slope is less than the first slope.

15. The system of claim 10 wherein the memory comprises an embedded non-volatile memory (eNVM).

16. A method for protecting against a side channel voltage glitch attack (SCA) in a secure memory system, the method comprising:
monitoring a supply voltage (VCC) with a first reset-detector coupled to the supply voltage and to a power-on-reset (POR) block, and, when the supply voltage decreases below a predefined minimum supply voltage ($VCC_{MIN}$) and remains low for at least a first time, providing a first reset detect (RST_DET) signal from the first reset-detector to the POR block to cause the POR block to generate a global-reset-signal; and
concurrently monitoring the supply voltage with a glitch-detector coupled to the supply voltage and to a second reset-detector, and, when the supply voltage decreases below a predefined glitch voltage ($VCC_{GLITCH}$) and remains low for at least a second time, providing a glitch-detect (GLTH_DET) signal to the second reset-detector, providing a second RST_DET signal from the second reset-detector to the POR block to cause the POR block to generate the global-reset-signal, wherein $VCC_{GLITCH}$ is less than $VCC_{MIN}$, and the second time is less than the first time.

17. The method of claim 16, wherein providing the GLTH_DET signal to the second reset-detector comprises retaining the GLTH_DET signal in the second reset-detector, and wherein providing the second RST_DET signal from to the POR block comprises recalling the GLTH_DET signal was received when the supply voltage is restored to the second reset-detector.

18. The method of claim 17, wherein retaining the GLTH_DET signal comprises discharging an internal trip point node in the second reset-detector to 0V.

19. The method of claim 16 wherein $VCC_{GLITCH}$ is 0V or less.

20. The method of claim 16 wherein the second time is 20 ns.

* * * * *